United States Patent [19]

Liran

[11] Patent Number: 4,754,168

[45] Date of Patent: Jun. 28, 1988

[54] CHARGE PUMP CIRCUIT FOR SUBSTRATE-BIAS GENERATOR

[75] Inventor: Tuvia Liran, Haifa, Israel

[73] Assignee: National Semiconductor Corporation, Santa Clara, Calif.

[21] Appl. No.: 8,188

[22] Filed: Jan. 28, 1987

[51] Int. Cl.[4] ........................ H03L 1/00; H01L 27/04; H01L 29/94; H03K 3/013

[52] U.S. Cl. ................................ 307/296 R; 307/303; 357/23.6

[58] Field of Search .................... 307/296 R, 297, 304, 307/296 A, 296.2, 303.2

[56] References Cited

U.S. PATENT DOCUMENTS

| | | | |
|---|---|---|---|
| 4,044,373 | 8/1977 | Nomiya et al. | 357/41 |
| 4,208,595 | 6/1980 | Gladstein et al. | 307/297 |
| 4,264,857 | 4/1981 | Jambotkar | 307/304 X |
| 4,377,756 | 3/1983 | Yoshihara et al. | 307/296 R |
| 4,439,692 | 3/1984 | Beekmans et al. | 307/304 X |
| 4,471,290 | 9/1984 | Yamaguchi | 307/200 B X |

*Primary Examiner*—Stanley D. Miller
*Assistant Examiner*—David R. Bertelson
*Attorney, Agent, or Firm*—Limbach, Limbach & Sutton

[57] ABSTRACT

A substrate bias generator of the type that includes a driver for providing an AC signal to a charge pump node, a first switch coupled between the charge pump node and ground such that charge is pumped from the charge pump node to ground when the voltage at the charge pump node is near its peak, and a second switch coupled between the charge pump node and the substrate such that charge is pumped to the charge pump node from the substrate when the voltage at the charge pump node is near its most negative value. A unidirectional switch is provided between the first switch and ground to prevent charge from flowing from ground to the charge pump node when the second switch is open.

4 Claims, 2 Drawing Sheets

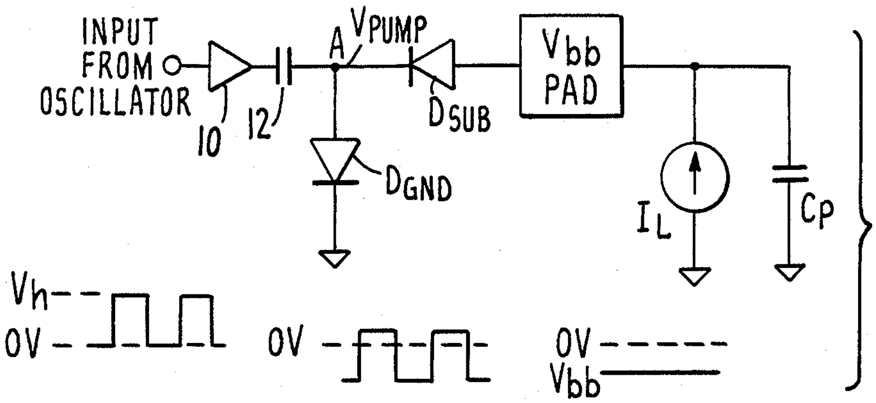
(PRIOR ART)
FIG. 1.
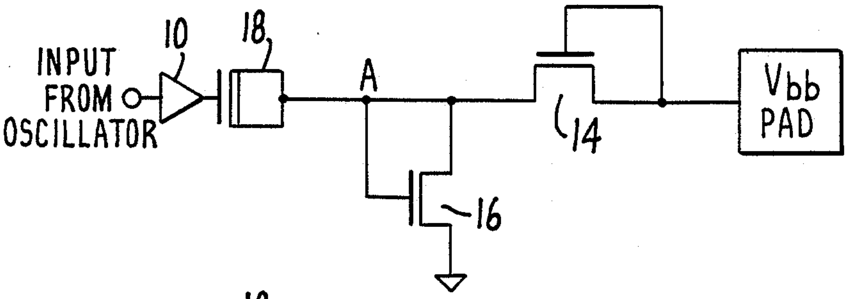
(PRIOR ART)
FIG. 2.
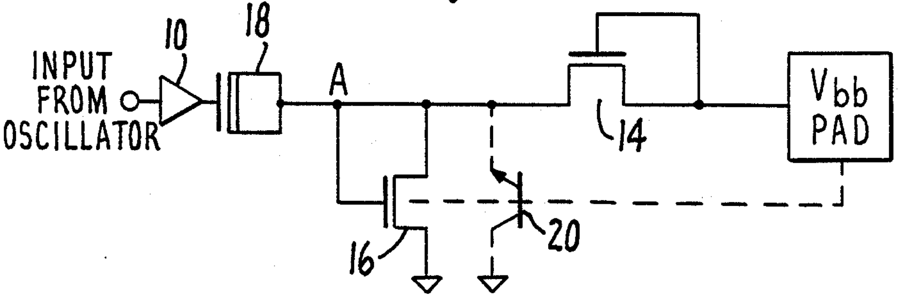
(PRIOR ART)
FIG. 3
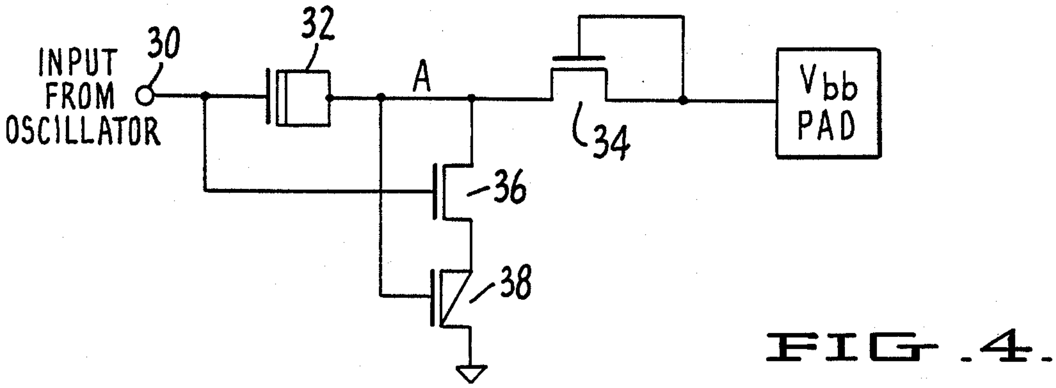
FIG. 4.
SCHEMATIC SYMBOLS OF TRANSISTORS:
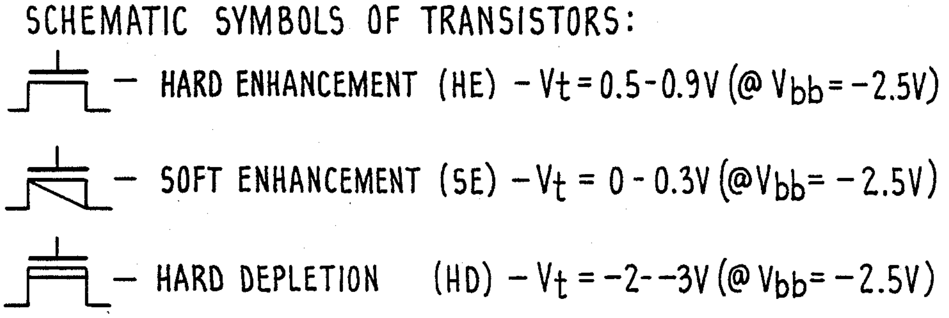

CHARGE PUMP CIRCUIT FOR SUBSTRATE-BIAS GENERATOR

BACKGROUND OF THE INVENTION

1. Field of the Invention

The present invention relates to semiconductor integrated circuits and, in particular, to a circuit for reducing the clamping voltage in a charge pump for a substrate-bias generator thereby increasing the efficiency and stability of the substrate-bias generator by decreasing the power dissipated by the circuit elements.

2. Discussion of the Prior Art

Recent innovations in N-channel silicon-gate metal-oxide-semiconductor field effect transistor (MOSFETs) processing technology have resulted in very large scale integrated circuits. These high density circuit geometries are so small that MOSFET channel lengths are now comparable to the base widths of bipolar transistors and gate oxides thicknesses have been reduced to below 400 Angstroms. This has opened the way for a generation of N-channel integrated circuits which can operate on supply voltages in the 2–3 $V_{DC}$ range.

Unfortunately, positive trapped charge that exists in the oxide layer near the surface of the silicon substrate and the positive charge of most undesired ionic contaminants tend to cause N-channel MOSFETs to convert to the depletion mode of operation. For example, in 5V systems, a 0V signal will not turn off an N-channel transistor if it has converted to the depletion mode. This problem was the initial reason for the use of substrate-biasing circuits with N-channel devices, i.e. to control and guarantee a constant threshold voltage.

The use of a negative substrate-bias voltage provides several advantages. It lowers the diffusion-to-substrate capacitance without requiring a decrease in substrate doping. It also protects the device against forward-biasing of diffused PN junctions due to voltage undershoots at the nodes. If feedback is provided, the substrate-bias voltage can also compensate for some device parameter variations.

A description of conventional substrate-bias generating circuitry is provided by Lance A. Glasser and Daniel W. Dobberpuhl, *The Design and Analysis of VLSI Circuits,* Addison-Wesley publishing, pp. 301–308. As described by Glasser and Dobberpuhl, a negative substrate-bias voltage is generated by pumping electrons out of the device's ground node and into the substrate. In most cases, a bond wire connects the $V_{bb}$ pad to the die bed, making a good contact to the substrate.

An idealized model of a conventional substrate-bias generator is shown in FIG. 1. A driver 10 amplifies an AC input signal generated by an oscillator and powers the charge pump. The power is coupled to the charge pump through capacitor 12. Two diodes, designated $D_{gnd}$ and $D_{sub}$, gate the charge out of the substrate and into the ground node. When the voltage $V_{pump}$ at node A is near its peak value, then diode $D_{gnd}$ is forward-biased and charge is pumped into the ground node; at this time, diode $D_{sub}$ is off. During the other half of the cycle, that is, when voltage $V_{pump}$ is near its most negative value, diode $D_{gnd}$ is off while diode $D_{sub}$ drains charge out of the substrate.

The theoretical minimum value of the substrate-bias voltage $V_{bb}$ is determined by the peak-to-peak value of $V_{pump}$ and the voltage drops in the two diodes $D_{gnd}$ and $D_{sub}$. During the high part of the cycle, $V_{pump}$ must be one diode drop above ground to pump charge. On the low side of the cycle, $V_{pump}$ must be one diode drop below $V_{bb}$ to do any work. Assuming the maximum peak-to-peak voltage of $V_{pump}$ is less than $V_{dd}$, then the minimum value of $V_{bb}$ is greater than or equal to $-V_{dd}+2$ diode drops. As shown in FIG. 1, because of leakage currents $I_L$ and parasitic capacitances $C_p$, such an ideal value is rarely achieved.

Due to constraints imposed by N-channel technology, diode $D_{gnd}$ is generally implemented as an enhancement-mode transistor 16 with its gate and drain tied together. Diode $D_{sub}$ may also be implemented as an enhancement mode transistor 14. A charge pump circuit which implements this substitution of transistors 14 and 16 is shown in FIG. 2. As further shown in FIG. 2, capacitor 12 of FIG. 1 is typically implemented as a depletion mode transistor 18 with its source and drain connected together and with its gate connected to receive the output of driver 10.

When the input voltage to the substrate-bias generator circuit shown in FIG. 2 varies from $V_h$ to 0V, the voltage at node A varies from the threshold voltage $V_{T16}$ of transistor 16 (which typically is about 0.8 volts) to $V_{T16}-V_h$. The voltage at the $V_{bb}$ pad is then pumped to a value of $V_{T16}+V_{T14}-V_h$, which is higher than the minimum voltage at node A by $V_{T14}$, the threshold voltage of transistor 14.

As shown in FIG. 3, in the conventional substrate-bias generator circuit, there is a hidden bipolar transistor 20. This transistor might discharge node A and causes the absolute voltage at the $V_{bb}$ pad to drop. This effect is more significant for high threshold voltages of transistor 14 when the base-emitter voltage becomes higher, and at high temperature when the turn-on voltage of the base-emitter junction becomes lower and the beta of hidden transistor 20 increases.

By decreasing the threshold voltages of transistors 14 and 16, a more negative voltage can be achieved. This decrease can be implemented by using a non-implanted transistor. Unfortunately, this technique is very risky and unstable because, at low substrate-bias voltages and at high temperature, the non-implanted transistor becomes depleted. It then conducts in both directions, disturbs the pumping action and drops the substrate-bias voltage to a less negative value.

SUMMARY

It is an object of the present invention to provide a substrate-bias generator which increases the absolute value of the substrate-bias voltage.

It is also an object of the present invention to provide a substrate-bias generator having no leakage problems or parasitic effects to impact on the stability of the circuit or its dependency on temperature.

These and other objects of the invention are accomplished by providing a substrate-bias generator which comprises a capacitive driver for providing an AC signal to a charge pump node, a first switch coupled between the charge pump node and ground and a second switch coupled between the charge pump node and the substrate. When the voltage at the charge pump node is near its maximum value, the first switch is conductive and the capacitor is charged to maximum voltage. When the voltage at the charge pump node is near its minimum value, the second switch is conductive and charge is drained from the substrate to the charge pump node. A unidirectional switch is provided between the charge pump node and ground to prevent charge from flowing from ground to the charge pump node when the second switch is open.

Other objects, features and advantages of the present invention will become apparent and be appreciated by referring to the detailed description provided below which is to be considered in conjuction with the accompanying drawings.

DESCRIPTION OF THE DRAWINGS

FIG. 1 is a schematic diagram illustrating an idealized model of a conventional substrate-bias generator circuit.

FIG. 2 is a schematic diagram illustrating a conventional substrate-bias generator circuit implemented with MOS transistors.

FIG. 3 is a schematic diagram illustrating a hidden bipolar transistor which exists in the FIG. 2 circuit.

FIG. 4 is a schematic diagram illustrating a substrate-bias generator in accordance with the present invention.

DESCRIPTION OF A PREFERRED EMBODIMENT

Figure 5:
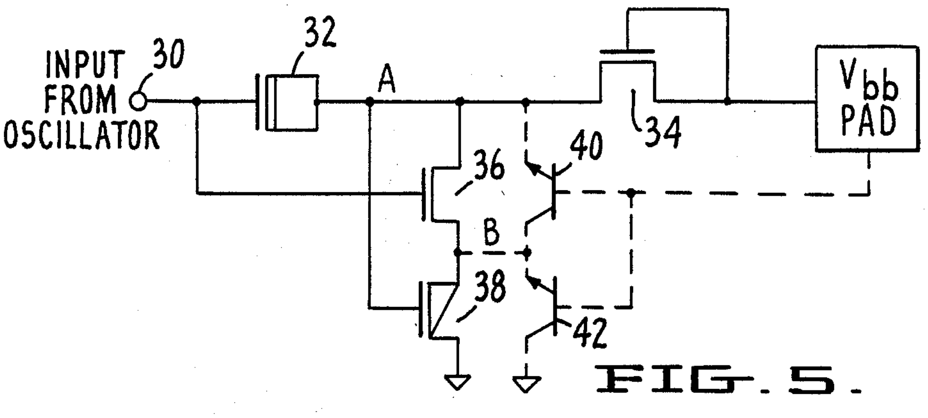
FIG. 5 is a schematic diagram illustrating hidden bipolar transistors which exist in the FIG. 4 circuit.

FIG. 4 shows a substrate-bias generator circuit in accordance with the present invention. Node 30 provides an input voltage from an oscillator to the gate of hard depletion transistor 32 in the conventional manner. The oscillator may be of any conventional design such as a ring oscillator or a Schmitt trigger configuration of the type described in the above-mentioned Glasser/Dobberpuhl publication.

The source and drain of hard depletion device 32 are connected together and, in turn, connected to node A. The threshold voltage of device 32 in the illustrated embodiment is about −2 to −3V.

A hard enhancement transistor 34 provides a switch between node A and the device substrate, designated "$V_{bb}$ pad" in FIG. 4. The source of device 34 is connected to node A while its drain and gate are commonly-connected to the $V_{bb}$ pad in the conventional manner.

In accordance with the present invention, a hard enhancement switching transistor 36 and a soft enhancement transistor 38 are coupled in series between node A and ground. The gate of hard enhancement device 36 is connected to oscillator input node 30. The gate of soft enhancement device 38 is connected to node A.

As indicated in FIG. 4, in the illustrated embodiment and with $V_{bb}=-2.5V$, the threshold voltage of the two hard enhancement devices 34 and 36 is about 0.5–0.9V and the threshold voltage of the soft enhancement device 38 is about 0.0–0.3V.

When the input voltage applied to node 30 equals $V_h$, transistor 36 is on in the linear region and, thus, its drain-source voltage is very low. (In the conventional circuit shown in FIG. 2, transistor 16 is in the saturation region when $V_{in}=V_h$). Soft enhancement transistor 38 acts like a unidirectional switch since its threshold voltage is greater than OV. Thus, it decreases the voltage in node A in comparison with the conventional circuit described above, enabling transistor 32 to be charged to a higher voltage. When the input voltage is low, transistor 38 prevents current flow from ground to node A.

That is, even if there is any subthreshold current through transistor 38, it will draw some voltage on transistor 36 causing the gate-source voltage to be negative and turning transistor 38 off. Thus, connecting the gate of transistor 38 to node A provides negative feedback that prevents leakage through transistors 36 and 38 from ground to node A.

The circuit shown in FIG. 4 provides several major advantages over the conventional circuit shown in FIGS. 1–3. First, the absolute value of the substrate-bias voltage is higher because the minimum voltage at node A is the threshold voltage of transistor 38, which is lower than the threshold voltage of transistor 36 (about 0.8V). Measurements by microprobing and simulation of the signal at node A demonstrate that the actual maximum voltage at node A is 0.4V in the circuit of the present invention, while in the conventional circuit it is about 1.1V (as measured on National Semiconductor Corporation's NS32332 microprocessor.). Second, as described below, the effect of the hidden bipolar transistor shown in FIG. 3 is disabled. Third, there are no leakage problems or any parasitic effects that may destroy the stability of the circuit.

FIG. 5 illustrates the existence of two hidden series-connected bipolar transistors 40 and 42 in the circuit shown in FIG. 4. When the voltage at node A is negative, transistor 36 is on and transistor 38 is off. In this case, the voltage at node B is the same as the voltage at node A. Since the $V_{CE}$ voltage of hidden transistor 40 is zero, it will not draw current into node A. If hidden transistor 42 turns on, then transistor 36 acts like an emitter resistor and turns transistor 42 off.

Figure 6:
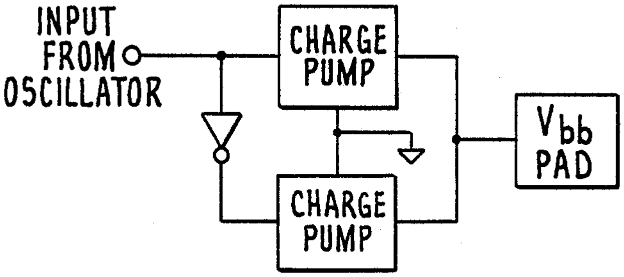
FIG. 6 is a schematic diagram illustrating a double pump embodiment of the substrate-bias generator of the present invention.

FIG. 6 shows an alternative "double pump" embodiment of the present invention.

Figure 7:
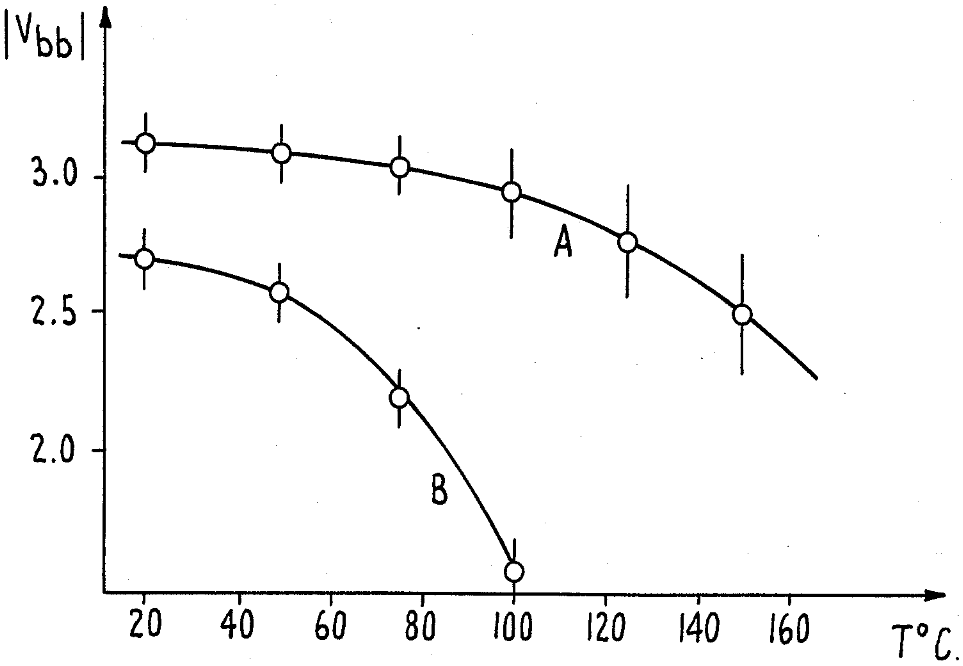
FIG. 7 is a graph illustrating the temperature dependency of the substrate-bias voltage generated by the substrate-bias generator of the present invention versus that of the conventional circuit shown in FIGS. 1–3 as measured on National Semiconductor Corporation's NS32332 32-bit microprocessor.

FIG. 7 shows the temperature dependency of the substrate-bias voltage $V_{bb}$ which is generated by the circuit shown in FIG. 4 (trace A) as compared with the conventional circuit shown in FIGS. 1–3 (trace B).

It should be understood that various alternatives to the embodiment shown herein may be employed in practicing the present invention. It is intended that the following claims define the invention and that circuits within the scope of these claims and their equivalents be covered thereby.

What is claimed is:

1. In a substrate bias generator circuit of the type used for generating a negative substrate voltage in N-channel semiconductor integrated circuits and which includes a driver for providing an AC signal to a charge pump node, first switching means coupled between the charge pump node and a ground node and second switching means coupled between the charged pump node and the substrate and wherein, when the voltage at the charge pump node is greater than a first value, charge is pumped into the ground node through the first switching means and, when the voltage at the charge pump node is less than a second value, charge is drained from the substrate through the second switching means, the improvement comprising means for preventing charge from flowing through the first switching means from the ground node to the charge pump node when the voltage at the charge pump node is less than the second value.

2. A substrate bias generator comprising:

a driver for providing an AC signal to a charge pump node;

a first switch coupled between the charge pump node and ground such that charge is pumped from the charge pump node to ground when the voltage at the charge pump node exceeds a first value;

a second switch coupled between the charge pump node and the substrate such that charge is pumped to the charge pump node from the substrate when the voltage at the charge pump node is less than a second value; and a unidirectional switch connected between the first switch and ground for preventing charge from flowing from ground to the charge pump node when the voltage at the charge pump node is less than the second value.

3. A substrate bias generator as in claim 2 wherein the unidirectional switch comprises an N-channel transistor the gate of which is connected to the charge pump node.

4. A substrate bias generator comprising:

a first N-channel transistor having a gate which is connected to receive an AC input voltage and the source and drain of which are connected to a charge pump node;

a second N-channel transistor having its source connected to the charge pump node and its drain and gate connected to the substrate;

third and fourth N-channel transistors connected in series between the charge pump node and ground, the gate of the third transistor being connected to receive the AC input voltage, the gate of the fourth transistor being connected to the charge pump node, the threshold voltages of the second and third transistors being substantially equal and the threshold voltage of the fourth transistor being less then the threshold voltage of the second and third transistors.

* * * * *